United States Patent [19]

Goodman et al.

[11] 3,858,163

[45] Dec. 31, 1974

[54] PRINTED CIRCUIT BOARD CONNECTOR

[75] Inventors: David S. Goodman, Orange; Harold J. Prow, Jr., Costa Mesa, both of Calif.

[73] Assignee: International Telephone and Telegraph Corporation, New York, N.Y.

[22] Filed: June 6, 1973

[21] Appl. No.: 367,516

[52] U.S. Cl.... 339/176 MP, 317/101 DH, 339/206 R

[51] Int. Cl. .............................................. H01r 3/00

[58] Field of Search......... 339/17 L, 17 LM, 17 LC, 339/176 MF, 176 MP, 19, 205, 206 R, 339/198 M, 210 M, 211, 75 MP; 317/101 DH, 101 CC; 200/307

[56] References Cited

UNITED STATES PATENTS

| | | | |
|---|---|---|---|
| 2,925,537 | 2/1960 | Winkler | 317/101 DH |
| 3,482,201 | 12/1969 | Schneck | 339/176 MP |
| 3,737,833 | 6/1973 | Jerominek | 339/176 MF |
| 3,737,838 | 6/1973 | Mattingly, Jr. et al. | 339/176 MP |

*Primary Examiner*—David Smith, Jr.
*Attorney, Agent, or Firm*—Thomas L. Peterson

[57] ABSTRACT

A card edge connector for connecting conductive layers on two coplanar printed circuit boards without the use of a jumper cable. The housing of the connector is divided into two identical mated parts which are joined along facing edges thereof. A row of contact compartments are formed in each of the two parts that open at the facing edges thereof to provide interconnected pairs of compartments. Printed circuit board receiving slots are formed in the two parts which open at the remote edges thereof. A unitary contact in each of the interconnected compartments is formed with oppositely extending integral spring elements which extend into the slots for engagement with conductive layers on printed circuit boards inserted in the slots, whereby such layers are electrically interconnected by the contact.

3 Claims, 4 Drawing Figures

PATENTED DEC 31 1974 3,858,163

SHEET 1 OF 2

PRINTED CIRCUIT BOARD CONNECTOR

BACKGROUND OF THE INVENTION

The present invention relates generally to a printed circuit board connector and, more specifically, to a card-edge connector for interconnecting conductive layers on printed circuit boards.

Printed circuit board connectors are well known in the art for mounting the edges of printed circuit boards mounted in parallel relationship upon planar mounting plates. Such connectors are generally referred to as card edge connectors. Connectors of this type generally comprise a unitary molded housing have a plurality of parallel circuit board receiving slots formed therein. Contacts are positioned in compartments extending along the slots. The contacts engage conductive layers formed on printed circuit boards which are mounted in parallel relationship in the various slots. Sometimes it is desired to provide an electrical connection between conductive layers of different printed circuit boards mounted in the connector. Typically, this has been accomplished by the use of jumper cables which are connected to tails of the contacts that extend through the bottom of the connector housing and the mounting plate.

In our copending application entitled "Printed Circuit Board Connector," Ser. No. 367519, filed June 6, 1973 and assigned to the assignee of the present application, there is disclosed a card-edge connector for interconnecting the conductive layers of printed circuit boards mounted in parallel relationship without the use of jumper cables. Such connector comprises a housing which is formed with a row of pairs of interconnected contact compartments. Unitary contacts are mounted in each pair of compartments through openings formed in the bottom of the housing. The unitary contacts are formed with spring contacting elements which are positioned in printed circuit board receiving slots that open through the top of the housing. This connector has the advantage over the conventional use of jumper cables in that it is relatively inexpensive, requires less space, and decreases the resistance of the interconnection joints. For some applications, it is desirable to provide a card-edge connector having the advantages described in the aforementioned copending application and which mounts a pair of printed circuit boards in a coplanar relationship rather than in a parallel relationship. The purpose of the present invention is to provide such a connector.

SUMMARY OF THE INVENTION

According to the principal aspect of the present invention, there is provided a card-edge connector comprising a housing member which is divided into a pair of mated parts that are joined along facing edges thereof. Printed circuit board receiving slots are formed in each of the parts of the housing that open at the opposite edges of the parts. A row of contact compartments are formed in each of the parts. Corresponding compartments in the rows are longitudinally aligned and open at the respective facing edges of the parts to provide interconnected pairs of compartments. The slots and the compartments in each part of the housing member are in communication with each other. A unitary contact is mounted in each of the interconnected compartments in the mated parts of the housing member. Each contact is provided with oppositely extending integral spring elements formed with contacting portions which are positioned in the slots to engage conductive layers on printed circuit boards inserted into the slots whereby such layers are electrically interconnected by the contact. Thus, by the edge-board connector of the present invention, printed circuit boards may be mounted in coplanar relationship with the conductive layers thereon electrically interconnected without the use of jumper cables. Because of the arrangement of the mated parts of the housing member and the unitary contacts, the outer edges of the mated parts may be formed with lip portions which extend over the free ends of the spring elements of the contacts to protect the contacts from damage during insertion of the printed circuit boards into the slots in the parts. In addition, such lips may be provided with slanted surfaces which cooperate with the spring elements of the contact to preload the same.

Other aspects and advantages of the invention will become more apparent from the following description taken in connection with the accompanying drawings.

DESCRIPTION OF THE PREFERRED EMBODIMENT

Figure 1:
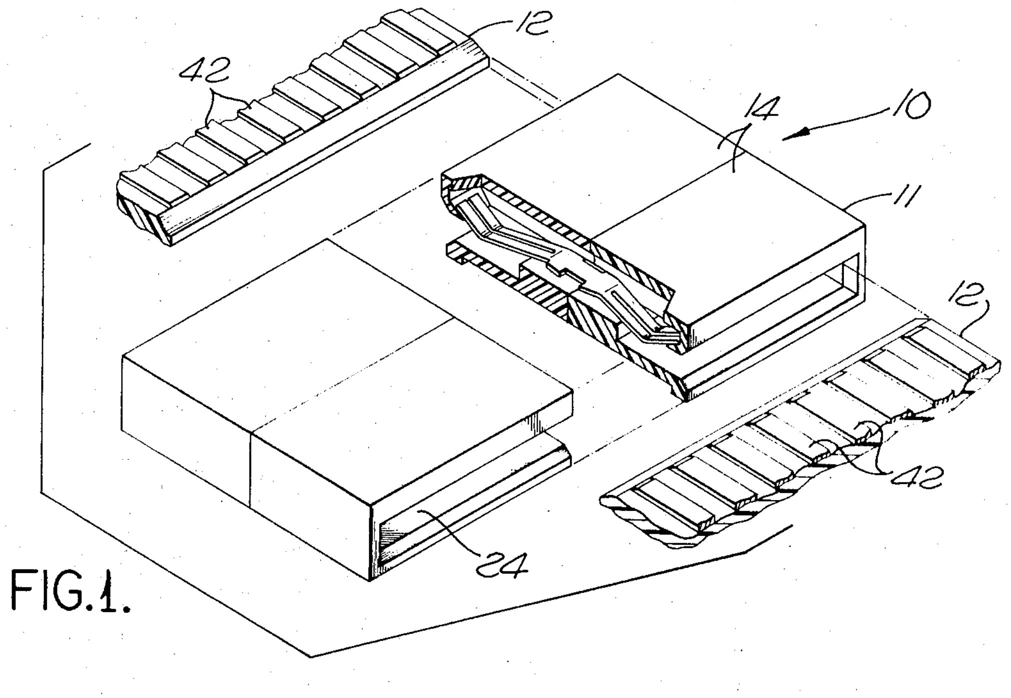
FIG. 1 is a perspective view illustrating the edge board connector of the present with portions broken away to illustrate the interior structure thereof and with two printed circuit boards positioned to be inserted into the connector.

Referring now to FIG. 1 in detail, there is shown the edge-board connector of the present invention, generally designated 10, which is used to interconnect a pair of printed circuit boards 12. The housing 11 of the connector is an elongated generally flat plastic molding which is divided into two mating identical parts, each designated 14. The parts 14 are joined together at their facing edges 16 by an arrangement of alternate hubs 18 and openings 20 formed along the edges. The hubs 18 in each of the parts 14 are frictionally engaged in the openings 20 in the other part. Preferably, a small groove 22 is formed in the wall of each of the openings to provide an air vent which allows each hub to be inserted into a corresponding opening.

Elongated coplanar printed circuit board receiving slots 24 are formed in the mated parts 14 of the connector housing. These slots open at the remote or opposite edges 26 of the parts. The slots 24 are chamfered, as indicated at 28, adjacent to the edges 26 to provide a lead-in ramp which facilitates insertion of the printed circuit boards 12 into the slots. It will be appreciated that because the slots 24 lie in a common plane, the printed circuit boards 12 will be coplanar when inserted in the slots in the connector 10.

The parts 14 of the housing 11 are also formed with a row of longitudinally aligned spaced contact compartments 30 which open at the facing edges 16 of the parts to provide interconnected pairs of compartments. The compartments 30 lie in a common plane which is parallel to the plane in which the printed circuit board receiving slots 24 lie. The contact compartments 30 in each part 14 are in communication with the inner portions of the corresponding slot 24. The parts are formed with outwardly facing ledges 32 which provide an end stop for the printed circuit boards 12 which are inserted into the slots 24.

A unitary contact 34 is mounted in each pair of interconnected compartments 30 in the connector housing 11. Each contact includes a generally flat intermediate mounting portion 36 and a pair of integral spring elements 38 which extend laterally and downwardly at an acute angle with respect to the intermediate mounting portion to curved contacting portions 40. The contacting portions extend into the corresponding slots 24 for engagement with conductive layers 42 formed on one side of the printed circuit boards 12. The spring elements 38 of each unitary contact are reversely bent at their free end sections 44 so as to extend back into the contact compartments 30.

Figure 3:
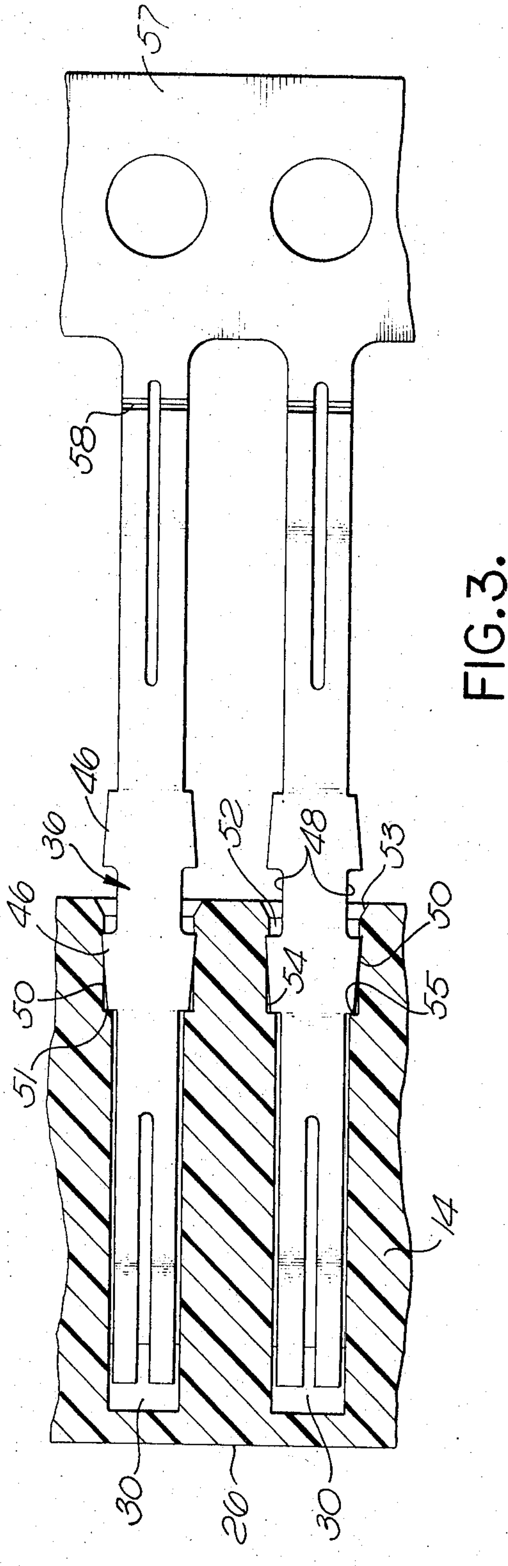
FIG. 3 is a longitudina horizontal section taken along the lines 3—3 of FIG. 2 showing the first part of the connector housing with the contacts being inserted therein.
Figure 4:
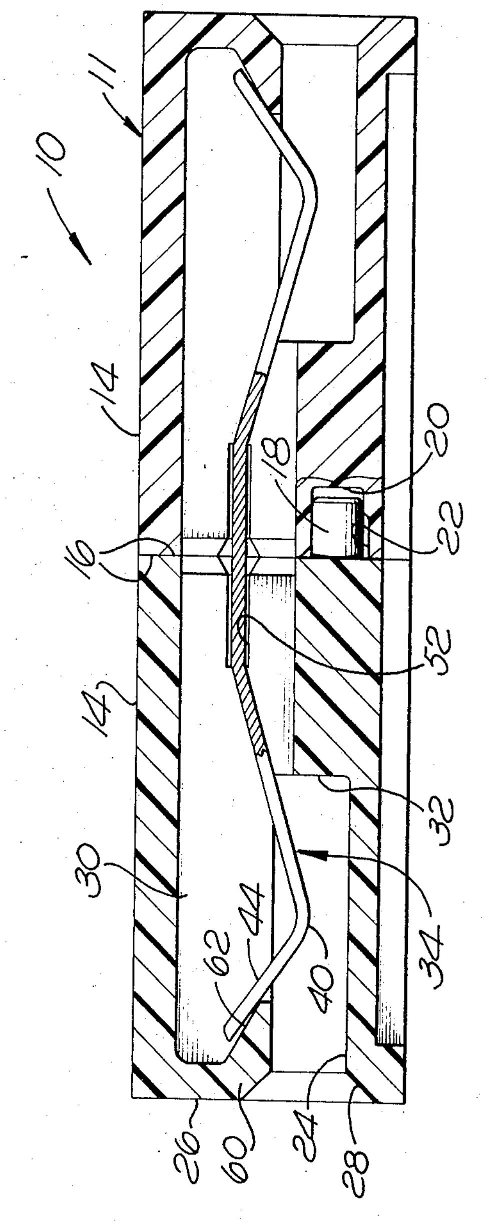
FIG. 4 is a partial transverse sectional view taken through a pair of interconnected contact compartments in the connector of the invention.

The mounting portion 36 of each contact 34 is formed with two pairs of outwardly extending projections 46 separated by recesses 48. The outer edges 50 of the projections 46 taper inwardly toward the free end sections 44 of the contact and terminate in shoulders 51. Horizontally extending slots 52 are formed on opposite sides of the contact compartments 30 in each part 14. The slots open at the facing edges 16 of the parts. Lead in chamfers 53 are formed in the slots 52. The respective pairs of projections 46 on the mounting portion of each contact have an interference fit with the opposite walls 54 of the slots 52. The shoulders 51 on the projections abut against the end surfaces 55 of the slots. Due to the interference fit between the mounting portion 36 of the contacts 34 and the walls of the slots 52 in the connector housing, the contacts are firmly retained in the connector. This interference fit also serves to interlock the housing parts 16 together. The width of the spring elements 38 of each contact 34 is slightly less than the width of the contact compartments 30, as best seen in FIG. 3, so that the contacts are properly laterally positioned in the housing 11 yet vertically movable in the compartments.

Preferably, the contacts 34 are made from a single long thin sheet of metal, joined by a common carrier strip 57. Any resilient metal having good electrical conductivity can be used for the contacts of this invention. One such metal is a phosphor bronze plated with nickel and then gold or silver. Another resilient metal which may be used is a beryllium-copper alloy. The contacts are initially stamped from a flat sheet and thereafter are formed in the desired configuration while the individual contacts are still joined together by the carrier strip 57. The contacts are slightly bevelled to a reduced section or groove 58 where the contacts are connected to the carrier strip 57 which allows the strip to be broken away from the contacts after the latter are inserted into the compartments 30 in one of the mated parts 14 of the connector housing 11.

Figure 2:
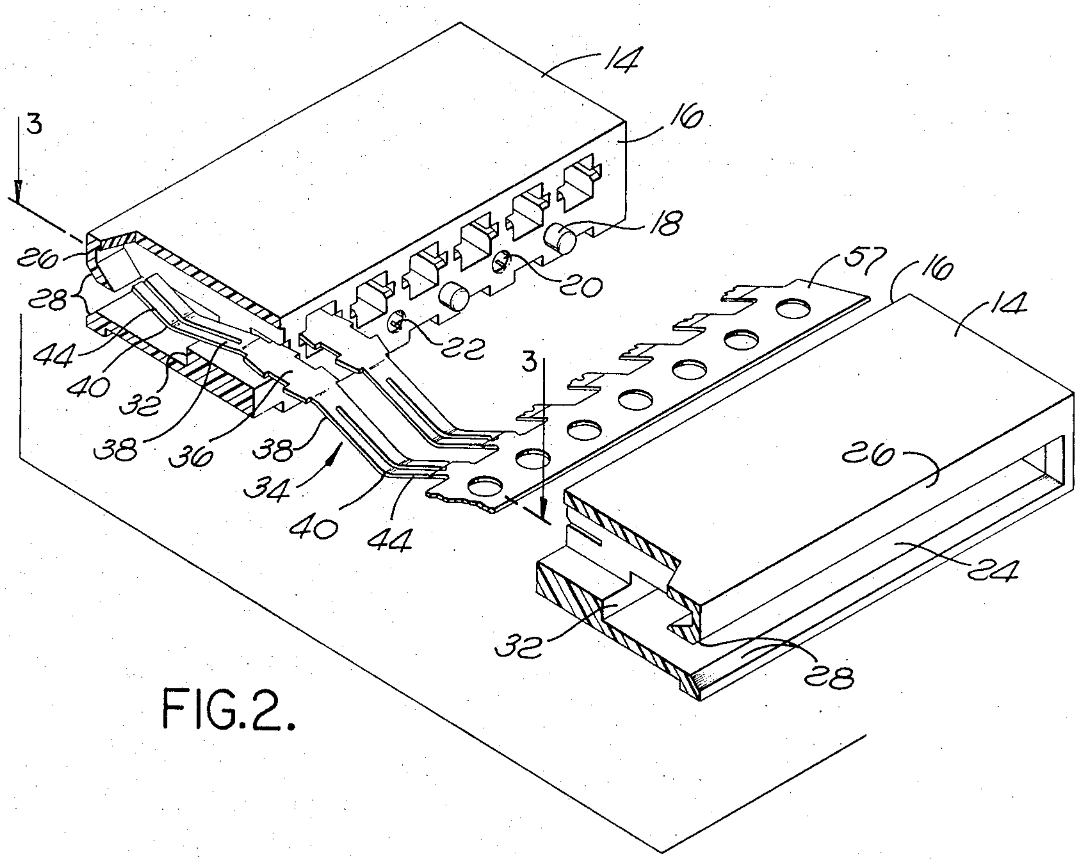
FIG. 2 is a fragmentary perspective view of one end portion of the connector illustrated in FIG. 1 with a plurality of contacts joined by a common carrier strip partially inserted in one of the mated parts of the housing member of the connector, with the other part being disconnected from the first part.

To assemble the connector 10, initially a plurality of contacts 34 joined by the carrier strip 57 are inserted simultaneously into the compartments 30 in one of the mated parts 14 of the connector housing, as best seen in FIG. 2. After the contacts are press fitted into the compartments 30 so that the shoulders 51 on the projections 46 engage the end surfaces 55, the carrier strip 57 is broken off from the contacts at the grooves 58. Thereafter the second mated part 11 of the connector housing is properly positioned so that the exposed free end sections of the contacts 34 are received in the compartments 30 in such part. Then the two parts are moved laterally into engagement with each other whereupon the hubs 18 on the respective parts which will frictionally engage in the openings 20 firmly holding the two parts of the housing together. It will be appreciated that an individual contact in the housing may be readily removed by simply separating the two mated parts 14 of the housing and withdrawing the contact from the compartment 30 in the housing part 14 in which it is retained.

Each part 14 of the housing 11 is formed with a lip 60 adjacent to the edge 26 which extends over and inwardly so as to cover the free end sections 44 of the contacts thereby providing a closed entry for the printed circuit boards 12 which are inserted into the slots 24 of the housing. Moreover, the inner surfaces 62 of the lips extend at a slight acute angle with respect to the free end sections 44 of the contacts so that when the contacts are mounted into the compartments 30, the free end sections will engage the inclined surfaces 62 thereby deflecting the spring elements 38 of the contacts upwardly into the compartments 30 whereby such spring sections are held in a preloaded condition.

When the printed circuit boards 12 are inserted into the respective slots 24 in the connector 10, the conductive layers 42 on the boards will engage the contacting portions 40 of each contact 34. Since such contacting portions are integral parts of a unitary contact, an electrical connection will be provided between aligned conductive layers 42 on the printed circuit boards 12.

From the foregoing, it will be appreciated that by the present invention there is provided a low cost and simple card-edge connector which allows interconnection of conductive layers on coplanar printed circuit boards without the requirement of jumper cables. Because the contacts 34 are inserted into the contact compartments from the facing edges 16 of the mated parts 14, the upper free end sections 44 of the respective spring elements of each contact may be disposed under a lip 60 which protects the spring elements from damage which might otherwise occur when a printed circuit board is inserted into the slots 24. Also, by this arrangement the spring elements 38 on the contacts are preloaded simultaneously upon the mounting of the contacts in the compartments 30. Moreover, the mounting of the printed circuit boards in coplanar relationship in the connector 10 of the present invention permits packaging arrangements which heretofore have not been possible.

What is claimed is:

1. A printed circuit board connector comprising:

a two-piece insulated housing member consisting of a pair of mated parts joined along facing edges thereof, said parts having edges remove from and generally parallel to said facing edges;

a printed circuit board receiving slot formed in each of said parts and opening at the respective remote edge thereof;

a row of contact compartments formed in each of said parts, corresponding compartments in said rows being longitudinally aligned and opening at the respective facing edges of said parts to provide interconnected pairs of said compartments, said slot and said compartments in each said part being in communication with each other;

a unitary contact mounted in each of said interconnected compartments and having an intermediate mounting portion and oppositely extending integral spring elements formed with contacting portions positioned in said slots to engage conductive layers on printed circuit boards inserted into said slots whereby said layers are electrically interconnected by said contact;

said contact compartments in each said part being sufficiently large to permit insertion of said contact spring elements thereinto from the facing edge of said part; and said mounting portions of said contacts being rigidly secured to wall portions of said compartments adjacent to said facing edges of said parts.

2. A connector as set forth in claim 1 wherein:

each said contact mounting portion is formed with laterally extending projections having an interference fit with the walls of its corresponding interconnected pair of compartments.

3. A printed circuit board connector comprising:

an elongated insulated housing member having longitudinally extending side edges with a row of laterally extending contact compartments formed therein between said side edges;

said housing member is longitudinally divided into a pair of mated parts joined along facing edges thereof;

a pair of printed circuit board receiving slots formed in said housing member each opening at a respective one of said side edges;

a unitary contact mounted lengthwise in each of said compartments and having an intermediate mounting portion and oppositely extending integral spring elements formed with contacting portions positioned in said slots to engage conductive layers on printed circuit boards inserted into said slots whereby said layers are electrically interconnected by said contact; and integral means formed on each of said parts adjacent to said facing edges thereof cooperating with said mounting portions of said contacts for rigidly securing said portions to said parts.

* * * * *